United States Patent [19]

Wiley

[11] Patent Number: 4,818,437
[45] Date of Patent: Apr. 4, 1989

[54] CONDUCTIVE COATINGS AND FOAMS FOR ANTI-STATIC PROTECTION, ENERGY ABSORPTION, AND ELECTROMAGNETIC COMPATABILITY

[75] Inventor: Robert E. Wiley, Port Huron, Mich.
[73] Assignee: Acheson Industries, Inc., Port Huron, Mich.
[21] Appl. No.: 757,029
[22] Filed: Jul. 19, 1985
[51] Int. Cl.$^4$ .............................................. H01B 1/06
[52] U.S. Cl. .................................. 252/511; 252/502; 252/503; 252/506; 252/510; 523/127; 523/468; 524/495; 524/496; 524/910; 524/911
[58] Field of Search ...................... 252/502, 511, 510; 523/137, 468; 524/495, 496, 910, 911; 260/DIG. 17, DIG. 21, DIG. 15

[56] References Cited

U.S. PATENT DOCUMENTS

| | | | |
|---|---|---|---|
| 1,504,292 | 8/1924 | Wickes . | |
| 2,328,198 | 8/1943 | Davenport et al. | 162/138 |
| 2,730,597 | 1/1956 | Podolsky et al. | 201/63 |
| 3,048,515 | 8/1962 | Dalton | 162/126 |
| 3,096,229 | 7/1963 | Whitman | 162/135 |
| 3,149,023 | 9/1964 | Bodendorf et al. | 162/135 |
| 3,151,050 | 9/1964 | Wilburn | 204/147 |
| 3,265,557 | 8/1966 | Frics et al. | 162/138 |
| 3,273,779 | 9/1966 | Mykleby | 229/14 |
| 3,367,851 | 2/1968 | Filreis et al. | 204/2 |
| 3,391,103 | 7/1968 | Mueller | 260/38 |
| 3,404,019 | 10/1968 | Gotshall | 106/307 |
| 3,444,183 | 5/1969 | Hubbuch | 260/32.6 |
| 3,505,263 | 4/1970 | Roth | 260/29.6 |
| 3,615,754 | 10/1971 | Gotshall | 106/30 |
| 3,653,498 | 4/1972 | Kisor | 206/46 |
| 3,746,157 | 7/1973 | I'Anson | 206/46 |
| 3,774,757 | 11/1973 | Harris et al. | 206/62 |
| 3,868,313 | 2/1975 | Gay | 204/196 |
| 3,870,987 | 3/1975 | Wiley | 338/214 |
| 3,954,674 | 5/1976 | Reis | 252/502 |
| 3,962,142 | 6/1976 | Freeman et al. | 252/502 |
| 4,035,265 | 7/1977 | Saunders | 252/510 |
| 4,037,267 | 7/1977 | Kisor | 361/220 |
| 4,038,693 | 7/1977 | Huffine et al. | 360/99 |
| 4,084,210 | 4/1978 | Forrest | 361/212 |
| 4,108,798 | 8/1978 | Sze et al. | 252/502 |
| 4,160,503 | 7/1979 | Ohlbach | 206/328 |
| 4,188,279 | 2/1980 | Van | 252/502 |
| 4,211,324 | 7/1980 | Ohlbach | 206/328 |
| 4,241,829 | 12/1980 | Hardy | 206/328 |
| 4,293,070 | 10/1981 | Ohlbach | 206/328 |
| 4,369,171 | 1/1983 | Grindstaff et al. | 252/502 |
| 4,444,837 | 4/1984 | Blum | 428/332 |
| 4,476,265 | 10/1984 | Blackwell, Jr. | 524/10 |
| 4,482,048 | 11/1984 | Blodgett | 206/328 |
| 4,483,840 | 11/1984 | Delhay et al. | 252/511 |

OTHER PUBLICATIONS

Preliminary Technical Bulletin 4-2-14c, Eccocoat Sec—Electrically Resistive Flexible Coating/Emerson & Cuming, 7/24/74.
Technical Bulletin 4-2-14B, Eccocoat 256 and 257, Carbon Based Lacquers, Emerson & Cuming, 2/6/75.
Conductive Paints for EMI Shielding, Grounding and Static Discharge, Tecknit, 1977.
Ends Static Interference, Acheson Colloids Co., Dec., 1974.
Electrodag Coatings, Acheson Colloids Co., 1971.
Kaleidoscope, Acheson Colloids Co., 1973.
Plastic World, Cahners Publishing Co., Inc., 3/19/76.
Condoct-O-Carton, Republic Packaging Corp.
Electrostatic Shielding, Acheson Colloids Co., 1955.
Electrodag +501, Acheson News, Product Application, Acheson Colloids Company, Division of Acheson Industries, Inc. (9/23/75).
Abstract, Lakokras Mater., Primenenie, No. 1, 1974, pp. 21-23 (In Russian), Inst. Pap. Chem., vol. 46, No. 6 1975, p. 618, Ioshpe, M. L.
The Strange Case of Element 6, Lubrication Engineering, 4/1961, Acheson Colloids Company.
A List of "Dag" Dispersions of Colloidal Graphite and Other Solids, DAG Dispersions, Acheson Colloids Limited, First Published 5/1955.
Conductive Coatings Cut Costs, Simplify Electrical Designs, Acheson Colloids Co., Nov., 1971.
Resistance Coatings, Acheson Colloids Co., Dec., 1970.
Aerodag G, Acheson Colloids Co., 1971.
Electrodag 37, Acheson Colloids Co., 1971.
Aquadag E, Acheson Colloids Co., 1971.

*Primary Examiner*—Josephine Barr
*Attorney, Agent, or Firm*—Harness, Dickey & Pierce

[57] ABSTRACT

Improved compositions are disclosed which are useful in providing a conductive layer of coating on a surface to provide protection against harmful electrostatic discharges. Also disclosed are compositions useful in absorbing and dissipating mechanical and electromagnetic energy and preventing electrostatic build-up; these compositions also provide electromagnetic compatability. The compositions contain elemental carbon and a polymeric matrix or binder. The improvement comprises employing a unique ground calcined, coal-based coke which approaches graphite in terms of its performance as a conductive additive or pigment but which does not possess the disadvantages associated with the use of graphite.

The unique coke employed in the compositions and methods of the present invention has a level of graphitic structure which approaches that of a true graphite. This level of graphitization can be most easily recognized by utilizing x-ray powder diffraction. More specifically, when the value of $E_c$ or the inverse carbon peak width (the 002 peak) is measured for this material using Mo $K_\alpha$ radiation ($\lambda = 0.71$ Å), the value is in the range of about 27 to about 80, and preferably about 28 to about 75.

The final compositions employ a polymer resin or matrix system as a binder.

The invention also relates to the method of applying the compositions to protect the article and reinforce the substrate, and the resulting coated articles, particularly containers for shipping and storage of electronic components and magnetic information-storage materials. The conductive coating may also add strength to the containers. The compositions may also be used to absorb both mechanical and electromagnetic energy thus providing EMC, and dissipate static electricity, thus preventing electrical static build-up.

35 Claims, No Drawings

CONDUCTIVE COATINGS AND FOAMS FOR ANTI-STATIC PROTECTION, ENERGY ABSORPTION, AND ELECTROMAGNETIC COMPATABILITY

The present invention relates to improved compositions which are useful in providing a conductive coating or layer upon or within a substrate. The compositions, which contain elemental carbon and a polymer binder or matrix, are improved by the addition of a unique high-conductivity/low-resistivity calcined coal-based coke.

More specifically, the present invention relates to a composition useful in the protection of electronic components and magnetic information-storage materials when they are packaged for shipment or storage. The composition is applied to the exterior and/or surfaces of a container means. The invention also relates to the method of protecting electronic components, of providing electromagnetic compatability between such components, as well as the method of improving the strength and integrity of a container by applying these compositions. The invention further relates to the resultant coated container.

These compositions are also useful in providing a conductive anti-static coating on other surfaces where random or stray electrostatic discharges are harmful, such as surfaces which come in contact with explosive gases.

The invention relates further to the use of the unique high-conductivity/low-resistivity ground calcined, coal-based coke impregnated or otherwise incorporated within a resin which is resilient when cured. The resulting resin composition is conductive; it also has the capability of absorbing both mechanical and/or electromagnetic energy, and is particularly suited for use in combination with the anti-static coatings described herein.

BACKGROUND OF THE INVENTION

It is well known that many electronic components and magnetic information-storage materials are extremely sensitive to stray and/or random electrostatic discharges. Such discharges can destroy the components usefulness; it may also destroy or distort information stored in magnetic form.

Such sensitive components and materials are susceptible to harmful discharges during packaging, shipment, storage, and other handling procedures. Conventional precautions include grounding the devices in question during shipping and building protection into the devices with zeno diodes to provide protection from static discharge. Other precautions include the use of a Faraday cage, a mesh or screen fashioned from a conductive metal. The cage is then placed over the shipping container, or made an integral part thereof.

Another recognized method is described in U.S. Pat. No. 4,241,829, issued to Hardy, et al., Dec. 30, 1980, and expressly incorporated herein by reference. The patentee describes a box with a continuous conductive coating overlying substantially all of interior and exterior surfaces and a convoluted foam liner impregnated with a conductive material; the patentee further requires that the conductive material in the foam form a continuous conductive path with the coating setting up a continuous conductive path between the exterior surfaces and the articles in the container. The patentee teaches that conductive coating and the conductive material in the foam should be a solution including both carbon and graphite.

Other art-disclosed applications are found in the specifications of U.S. Pat. Nos. 4,160,503; 4,211,324; 4,293,070; and 4,482,048; all of the foregoing being expressly incorporated herein by reference.

Many other systems employing elemental carbon are also known. For example, U.S. Pat. No. 3,868,313, issued to P. J. Gay, Feb. 25, 1975, discloses a cathodic protection system comprising applying an electrically insulating coating on the substrate followed by the application of an electrically conductive coating applied over the insulating coating. A D.C. voltage is then applied between the metal substrate and the conductive coating.

U.S. Pat. No. 3,151,050, issued Sept. 19, 1964, discloses methods for cathodic protection for vehicles and components in storage. The method comprises the application of an electrically conductive paint to the metal to be protected. The paint is a suspension of carbon, maganese dioxide, ammonium chloride and an organic filler and a solvent such as methyl-ethyl-ketone. A second coating of resin containing metallic copper is then applied, followed by a final coat of paint or enamel. Lastly a D.C. voltage is applied between the conducting paint and the metal base.

U.S. Pat. No. 4,035,265, issued July 12, 1977, to J. A. Saunders discloses electrically conductive paint compositions employing graphite and colloidal carbon. The graphite is subjected to wet grinding so as to reduce the graphite to thin platelets. The colloidal carbon employed consists of particles having a size from 20 to 50 millimicrons. The final composition (including the article it is applied to) is used as a heat source when electrical current is passed through the coating.

Other efforts at carbon-containing coatings are found in (1) U.S. Pat. No. 3,505,263, which discloses finely divided calcined petroleum coke in a polymer latex binder;

(2) U.S. Pat. No. 3,404,019, which discloses the use of fluid petroleum coke as a filler or pigment in polymeric compositions;

(3) U.S. Pat. No. 2,730,597, which discloses resistance elements which optionally employ various materials in a resin base;

(4) U.S. Pat. No. 4,476,265, which discloses poly (arylene sulfide) compositions which contain a "black carbonaceous pigment";

(5) U.S. Pat. No. 4,444,837, which discloses coating or sealing-type plastisols which contain carbon dust as a filler;

(6) U.S. Pat. No. 3,391,103, which discloses phenolic resin compositions which employ "oxidized carbon particles";

(7) U.S. Pat. No. 3,615,754, which discloses an ink which employs 2 to 10 percent of ground coke; and (8) U.S. Pat. No. 3,444,183, which discloses a film forming composition made from a heat-resistant polymer and a dispersion of carbon particles.

All of the foregoing are expressly incorporated herein by reference.

SUMMARY OF THE INVENTION

The present invention relates to improved compositions useful in providing a conductive layer or coating on a surface to provide protection against harmful electrostatic discharges. The present invention also relates to compositions useful in absorbing and dissipating mechanical and electromagnetic energy and preventing electrostatic build-up. The compositions contain elemental carbon and a polymeric matrix or binder. The improvement comprises employing a unique ground calcined, coal-based coke which approaches graphite in terms of its performance as a conductive additive or pigment but which does not possess the disadvantages associated with the use of graphite.

The unique coke employed in the compositions and methods of the present invention has a level of graphitic structure which approaches that of a true graphite. This level of graphitization can be most easily recognized by utilizing x-ray powder diffraction. More specifically, when the value of $E_c$ or the inverse carbon peak width (the 002 peak) is measured for this material using Mo K$\alpha$ radiation ($\lambda=0.71$Å), the value is in the range of about 27 to about 80, and preferably about 28 to about 75. In a highly preferred embodiment, the cokes employed in the compositions and methods of the present invention contain $SiO_2$, $Fe_2O_3$, $Al_2O_3$, $Ca_2O$, $K_2O$ and $Na_2O$, have a carbon content of at least about 90 percent, and more preferably about 94.5 percent, by weight of the coke, and an ash content of about 0.1 percent to about 1.5 percent, by weight of the coke. The weight:weight ratio of $SiO_2:Fe_2O_3$ in the ash is in the range of about 3:1 to about 7:1, and the weight:weight ratio of $Fe_2O_3:Al_2O_3$ in the ash is in the range of about 1:1 to about 6:1.

The final compositions employ a polymer resin or matrix system as a binder.

The invention also relates to the method of applying the compositions to protect the article and reinforce the substrate, and the resulting coated articles, particularly containers for shipping and storage of electronic components and magnetic information-storage materials. The conductive coating may also add strength to the containers. The compositions may also be used to absorb both mechanical and electromagnetic energy and dissipate static electricity, thus preventing electrical static build-up.

DETAILED DESCRIPTION OF THE INVENTION

As used herein, the term "absorption of electromagnetic energy" includes the entire electromagnetic spectrum, including energy which is observed to have a frequency of about $10^2$ cycles per second to about $10^{20}$ cycles per second and a frequency of about $10^4$ meters to about $10^{-10}$ meters.

By the term "absorb" as used herein is meant that at least some fraction of the particular type of energy modified by the phase is absorbed.

It will be appreciated that a wide variety of carbon-based materials possessing a wide variety of particle shapes and sizes have been employed in polymer-based coatings. These materials have been generally employed as pigments to add conductivity to the final compositions. However, it has now been discovered that a certain heretofore unrecognized ground coal-based calcined coke can be employed in combination with a polymer resin to provide an improved resin-coke system for conductive coatings of wide utility. These systems have particular utility as coating for container means used for shipping and storing electronic components and magnetic information-storage materials.

It will also be appreciated from the above background section that many elemental carbons and carbon-based materials have been used as conductive additives or pigments. When good conductivity is necessary, graphite has been the additive or pigment of choice.

Graphite, due to its allotropic form and crystalline structure, can be incorporated into a solvent or matrix to provide a final composition which has high conductivity and low resistivity. However, graphite suffers from several disadvantages which make it difficult to employ in coatings; two of these disadvantages appear to be associated with the very crystalline structure which make it so valuable as a conductive material.

Graphite is an allotropic form of elemental carbon consisting of layers of hexagonally arranged carbon atoms in a planar, condensed ring system. The layers are stacked parallel to each other in two possible configurations, hexagonal or rhombohedral. This structure, along with the covalent ($sp^2$ hybridization) bonding within the layers and Van der Waals forces holding the layer-layer arrangement together, make graphite extremely efficient as a conductive material and an excellent lubricant.

However, when incorporated into a polymer resin system which is applied to a surface and allowed to dry or cure, the incorporated graphite within the system will easily "transfer" to or rub off onto a second surface if the two surfaces are brought into frictional contact.

For example, if graphite is placed into an acrylic latex coating at a level that will provide conductivity, the resulting coating must be protected from contacting any other surface. Frictional contacting, such as simply rubbing your finger across the coating surface, would result in the transfer of a noticeable amount of graphite to your finger, i.e, the graphite will "rub-off" onto your finger.

As a result of this same transfer property, the graphite-containing composition cannot be durably overcoated, i.e., it will not accept a second decorative or protective overcoat. For the reasons discussed above, the second coating will not adhere to the graphite-containing material.

Another disadvantage associated with the use of graphite as an additive in polymer compositions is that graphite interferes with peroxide-type curing catalysts, e.g., peroxide-types.

A fourth (and frequently prohibitive) disadvantage associated with graphite is that many graphites, when compared to other carbon-based conductive additives, are extremely expensive.

As a result of these and other disadvantages, primarily the transfer property, the art has frequently turned to other types of elemental carbon such as carbon black, petroleum-based coke, and the like. It will be appreciated that the carbon blacks which are adequately conductive are extremely expensive; normal petroleum-based cokes are not adequately conductive.

Coke is generally considered to be the highly carbonaceous product resulting from the pyrolysis of organic material at least parts of which have passed through a liquid or liquid-crystalline state during the carbonization process and which consists of non-graphite carbon. See Carbon, 20:5, pp 445–449 (1982), incorporated herein by reference. Some cokes are capable of acting as conductive additives and pigments; some cokes provide no conductivity.

In addition to being much less expensive than graphites, conductive cokes possess the added advantage of not exhibiting transfer. However, because conventional cokes do not conduct as efficiently as graphite, the cokes which are conductive must be added at extremely high levels. Due to its reduced cost when compared to graphite, even at these high levels coke can be economically employed.

Regardless of the level employed, however, conventional conductive cokes simply have not been capable of achieving the level of conductivity that graphite and some carbon blacks can provide. There are therefore many uses heretofore where graphites had to be employed in spite of its transfer, overcoatability and cost disadvantages.

It has now been surprisingly discovered that a certain unique coke material is capable of demonstrating a conductivity/resistivity closely approaching that of graphite but which does not possess the curing, rub off, overcoatability and other disadvantages usually associated with graphites.

This unique coke material provides improved conductivity at reduced cost in a wide range of resin and resin solvent systems. The resulting compositions provide a wide variety of utilities. Further, this unique coke has the added unexpected advantage having low opacity and being able to maintain conductivity when the color is modified by the addition of other pigments. It has the further advantage of being able to accent such non-carbonaceous pigments while maintaining significant conductivity. Unlike conventional cokes and other carbon-based additives, the final composition need not be pigmented only by the coke; other pigments may be used.

When employed at the levels and ratios described herein, the final compositions of the present invention possess a conductivity/reduced resistance nearly equivalent to systems employing more expensive graphite, but without many of the disadvantages associated with graphite.

As mentioned above, the term "coke", as generally used in the art, refers broadly to the many high carbonaceous products of the pryolysis of organic material at least parts of which have passed through a liquid or liquid-crystalline state during the carbonization process and which consist of non-graphitic carbon. However, the term "coke" as applied to the compositions and methods of the instant invention refers to a small select subclass of cokes. From a structural viewpoint, the term "coke", as used herein, characterizes the state of a graphitizable carbon before the actual beginning of graphitization, i.e., before the solid state transformation of the thermodynamically unstable non-graphitic carbon into graphite by thermal activation.

The cokes useful in the practice of the present invention are cokes which have high conductivity/low resistivity and include only a select fraction of the materials generally referred to in the art as "coke". They are coal-based, calcined ground materials.

The cokes useful in the practice of the present invention are primarily classified by the possession of a level of graphitic order which is high enough to provide high conductivity/low resistivity when placed into a polymer matrix, but below that which results in a tendency to rub off and/or the inability to accept an overcoat. These cokes may be used as in place of graphite in certain compositions and methods; they may also be used in combination with graphites. They are particularly useful in these circumstances (where graphite is to be employed) because they will allow the graphite to be used at a significantly reduced level while allowing overcoatability and enhancing conductivity.

The most effective way of characterizing the cokes of the present invention is by x-ray powder diffraction. The material may be examined employing a conventional powder diffractometer fitted with a pyrolytic graphite monochromatic source. A power source such as a 12 kW rotating anode generator may be employed operating at about 55 kV and 160 mA; a molybdenum anode ($K\alpha$ radiation), providing an average x-ray wavelength $E_c$ of about 0.71Å, is also employed. The sample should be placed in a Lindemann glass tube having a diameter of about 0.8 mm. The c-axis carbon-carbon d-spacings and range of ordering along the c-axis are determined from the width of the carbon (002) peak producing an $E_c$ value. In general, the larger the $E_c$ value, the better the ordering, i.e., graphites have $E_c$ in the range of greater than 200. Cokes of the present invention possess an $E_c$ value of about 27 to about 80, more preferably about 28 to about 75, and still more preferably about 28 to about 65.

Useful cokes of this class may contain greater than about 80 elemental carbon by weight. The cokes preferred for use in the present invention possess a carbon content of greater than about 90 percent, more preferably about 94.5 percent, and still more preferably greater than about 95.0 percent, by weight. In a highly preferred embodiment, the cokes of the instant invention have a carbon content of about 95.0 to about 95.75, and even more preferably about 95.30 to about 95.40, by weight.

The preferred cokes for use in the present invention have an ash content of about 0.1 to about 1.5 percent, by weight of the coke. Even more preferably, the ash content is in the range of about 0.80 to about 1.25, and still more preferably about 1.0 to about 1.15, by weight.

In a highly preferred embodiment, the weight:weight ratio of $SiO_2:Fe_2O_3$ in the ash is in the range of about 3:1 to about 7:1, and still more preferably about 4:1 to about 6:1; in a highly preferred embodiment the ration is about 5:1. In these embodiments, the weight:weight ratio of $Fe_2O_3:Al_2O_3$ in the ash is in the range of about 6:1 to about 1:1, and still more preferably about 2:1.

The cokes preferred for use in the present invention contain a level of CaO in the ash of less than about 2.5 percent, more preferably less than about 1.0 percent, and still more preferably less than about 0.5 percent, by weight of the ash. In a highly preferred embodiment, the coke contains a level of CaO of about 0.5 percent, by weight of the ash, or about 0.00005 percent, by weight of the coke.

The cokes preferred for use in the present invention contain a level of $K_2O$ of less than about 0.75 percent, and more preferably about 0.5, and even more preferably about 0.25, percent by weight of the ash. In a highly preferred embodiment, the coke contains a level of $K_2O$ of less than about 0.20 percent by weight of the ash, or about 0.00002 percent by weight of the coke.

The coke may be employed with polymer-based binders or matrices alone, or in combination with other conductive and non-conductive pigments, including other carbon-based materials. However, in a preferred embodiment, the final composition is substantially free of graphite, due to graphite's interference with the stability and overcoatability of the final coating composition. By substantially free, as used herein, is meant that the final composition contains a level of less than about 10 percent, more preferably less than 5 percent, and still preferably less than about 1 percent graphite, by weight of the composition.

Other suitable materials useful in combination with the cokes described above include other elemental carbon fillers and pigments selected from the group consisting of carbon black, petroleum coke, calcined petroleum coke, fluid petroleum coke, metallurgical coke, other non-carbon pigments and additives which are useful include, without limitation, metals and metallic conductive and non-conductive materials usch as zinc, aluminum, copper, nickel, silver, ferrophosphorous, magnetic oxides and the like.

The coke is blended or otherwise combined with a resin or matrix system as a binder. It will be appreciated that the selection of the binder is primarily dependent upon the end use of the conductive coating or energy to be absorbed. For example, when selecting a binder for use in a composition to be employed as a protective anti-static material, it has been observed that it is desirable to select a binder which will adhere well to the surface to which it will applied, will be easy to apply, and which can be easily overcoated. When selecting a binder to act as an absorbent for both mechanical and electromagnetic energy, it is desirable to select a resilient-when-cured resin.

It will be appreciated that the binder selected for certain anti-static or static bleed applications can be selected to add strength to the containment-means. For example, a resin which cures in situ and gives the paper, cardboard or fiberboard container directional strength, such as a PVA/acrylic mixture, may be employed when strength is important. This may allow the use of a lighter or less expensive container material than otherwise need be employed. The use of cloth, fabric, or glass fibers may also add strength.

It will also be appreciated that when selecting a binder for an application which requires the absorption or dissipation of both mechanical shock and electrical shock, the selection of a conductive polyurethane foam would provide a final material which can be a cushion means as well as an anti-static conductive material; it could also be used to absorb sound, e.g., in anechoic chambers. The foam in either instance may also be made conductive by incorporation, impregnation, and/or coating with carrier systems containing a ground coal-based calcined coke having an $E_c$ of about 27 to about 80.

Preferred resins for the binders or binder systems of the present invention include polymeric materials such as acrylics, acrylic emulsions, an acrylic latex, polyvinyl acetate (PVA), polyvinyl chlorides (PVC), epoxys, and the like; mixtures of these may also be employed such as PVA/acrylic, PVC/acrylic, PVA/acrylic emulsions, PVC/acrylic emulsions, etc.

Particularly preferred materials include materials selected from the group consisting of methyl acrylate, ethyl acrylate, methyl methacrylate, ethyl methacrylate, allyl methacrylate, n-butyl methacrylate, isobutyl metacrylate, epoxys, polyvinyl chloride, polyvinyl acetate, polyvinylidine chloride, and mixtures thereof; particularly preferred mixtures of an acrylic and a polyvinyl polymer which include polyvinyl acetate/acrylic and polyvinyl chloride/acrylic emulsions such as AMSCO-RES 3077 manufactured by the Union 76 Company.

Other useful materials available as items of commerce include Rhoplex AC-64, AC-34, MC-76, HA-8, 1895, and 1829, all of which are acrylic emulsions available from Rohm and Haas.

Preferred binder resins for energy absorbing or dissipating purposes are materials which are resilient when cured. Such materials include foam resins such as cellulose acetate foams, phenolic foams, polyethene cross-linked and low-density foams, polystyrene foams, structural foams, silicone foams, and urethane foams. Particularly preferred binder resins include urethane foams, vinyl foams, silicones, and other resilient-when-cured resins. Still more preferred are polyurethane foam resins including so called "one package" and "two package" systems. Particularly preferred resins which are items of commerce include the HYPOL systems available from W. R. Grace & Co.

In addition to the polymer binder, suitable convention binder-compatible components may be employed in the coke-binder systems. For example, a suitable solvent or solvent blend or carrier may be employed. The solvent may be, for example, an organic solvent such as a conventional acrylic or methacrylic solvent system, including aromatic and aliphatic hydrocarbons, halogenated aromatic and aliphatic hydrocarbons, esters, ketones, and alcohols. Water may also be employed as a solvent, co-solvent, or as a solvent for one or more phases of an emulsion system.

In general, it will be appreciated that the solvent or carrier level and system will depend upon the resin selected, the intended use of the composition, the surface to be coated, or impregnated, and the like.

In a preferred coating composition embodiment, the solvent is present at a level of about 5 percent to about 93 percent, more preferably about 25 percent to about 90 percent, and still more preferably about 40 to about 80 percent, by weight of the composition. In the energy absorbing or dissipating compositions of the present invention, the preferred solvent system is water. The solvent is generally employed at a level of about 30 to about 93, more preferably about 40 to about 90 and still more preferably about 45 to about 90 percent, by weight of the uncured composition. The preferred solvent, or co-solvent for either of the above solvent systems, is deionized water. In a highly preferred embodiment, the carrier of solvent system comprises about 75 to about 100 percent deionized water, by weight of the solvent system.

Other common resin compatible components may also be employed at their art-established levels, including, without limitation, surfactants, emollients, wetting agents or other surface active agents, thickeners, buffers, neutralizing agents, chelating agents, anti-oxidants, curing agents, anti-microbials, anti-fungals, fire retardants, inert-decorative pigments, foaming agents, and plastic, glass or other fiber reinforcements, and the like.

Useful additives also include agents which are used to protect against various types of electromagnetic radiation or interference such as those described in U.S. Pat. Nos. 3,562,124 and 4,517,118, both incorporated herein by reference. The preferred materials include refractory ferro alloys including those selected from the group consisting of ferrophosphorous, ferromanganese, ferromolybdenum, ferrosilicon, ferrochrome, ferrovanadium, ferrozirconium, ferrotitanium, ferrotungsten, ferroboron, ferrocarbide, iron carbide, and magentic oxide. Of these, ferrophosphorous materials, such as a mixture of $Fe_2P$ and $FeP$, are particularly preferred. This material is generally designated as iron phosphide and has a phosphorous content in the range of about 20 to about 28 percent, by weight.

Preferred conductive additives for use in the compositions of the present invention include those disclosed in U.S. Pat. No. 3,870,987, issued Mar. 11, 1975, incorporated herein by reference. These include finely divided particulate pigments such as silver particles, nickel particles, copper particles, noble metal particles, and tin oxide. Particularly preferred are finely divided silver and copper.

In the wet (uncured) compositions of the present invention which are intended to be used as anti-static coatings, the resin polymer is preferably employed at a level of from about 2 to about 50 percent, by weight of the wet composition. More preferably, the resin is employed at a level of about 10 to about 50 percent, and still more preferably at a level of about 30 to about 50 percent, by weight.

In the wet (uncured) compositions of the present invention which are intended to be used in an energy absorbing or dissipating capacity, the resin polymer is preferably employed at a level of about 2 to about 50 percent, by weight of the wet composition. More preferably, the resin is employed at a level of about 10 to about 40, and still more preferably, about 10 to about 25 percent, by weight.

The coke (as expressly defined herein) is employed in the preferred anti-static coating compositions of the present invention at a level of about 0.5 percent to about 40 percent, by weight of the wet, uncured composition. More preferably, the coke is employed at a level of about 20 to about 25 percent, and still more preferably, at a level of about 5 to about 15 percent, by weight of the wet composition. In a highly preferred embodiment, the anti-static coating compositions of the instant invention employ a level of coke of about 5 percent to about 10 percent, by weight of the wet composition.

The coke is employed in the preferred energy absorbing compositions of the present invention at a level of about 0.5 percent to about 40 percent, by weight of the wet, uncured composition. More preferably, the coke is present at a level of about 2 percent to about 30 percent, even more preferably about 5 percent to about 25 percent, and still more preferably about 5 to about 20 percent, by weight of the wet composition. In a highly preferred embodiment, the coke is present at a level of about 5 to about 15 percent, by weight of the wet composition.

As noted above, the coke may be employed alone, or with other carbonaceous materials. When other elemental carbons are employed, such as carbon black, petroleum coke, calcined petroleum coke, fluid petroleum coke, metallurgical coke, and the like, the total elemental carbon in preferred compositions comprises about 5 percent to about 50 percent, by weight of the final wet composition. Of this total elemental carbon, about 5 percent to about 95 percent of the total elemental carbon is the unique ground coal-based calcined coke described herein. More preferably, the total elemental carbon is present at a level of about 5 percent to about 25 percent, of which about 50 percent to about 95 percent, and more preferably about 70 percent to about 95 percent, is the coal-based calcined coke.

The highly preferred anti-static coating compositions of the present invention are substantially free of graphite, i.e., they employ less than about 10 percent, more preferably less than about 5 percent, and still more preferably less than 1 percent graphite, by weight of the wet composition.

In a highly preferred embodiment of the anti-static coating compositions of the instant invention, the compositions employ about 20 to about 75 percent deionized water, by weight; about 0.1 to about 5 percent of a thickener such as hydroxyethyl cellulose and/or an acrylic thickener; about 0 percent to about 20 percent of a second carbon-based pigment or filler; about 0.01 percent to about 2.5 percent of a $C_3$–$C_{12}$ alcohol; and about 0.01 percent to about 2.5 percent of an antimicrobial-antifungal agent such as 2, 2-methylene-BIS-(4-chlorophenol).

Further, in a highly preferred embodiment of the energy absorbing compositions of the present invention, the compositions employ about 40 to about 85 percent deionized water, by weight, about 0.1 to about 5 percent of a thickener such as hydroxyethyl cellulose, about 0 to about 20 percent of a second carbon-based pigment or filler, about 0.01 to about 2.5 percent of a $C_3$–$C_{12}$ alcohol, and about 0.01 to about 2.5 percent of an antimicrobial-antifungal agent such as 2, 2-methylene-BIS-(4-chlorophenol).

In such preferred embodiments, a surfactant or emollient is also employed. Such surfactants are employed at a level of about 0.025 to about 5 percent, by weight of the wet composition, and more preferably at a level of about 0.05 to about 4 percent. In a highly preferred embodiment, the surfactant is employed at a level of about 0.1 percent to about 2 percent, by weight of the wet composition.

Any conventional compatible surfactant may be employed in the coating compositions of the present invention. Preferred surfactants include TAMOL SN, a neutral sodium salt of a condensed aryl sulfonic acid sold by the Rohm & Haas Company.

The preferred coating compositions are preferably about 10 to about 50 percent total solids, more preferably about 20 to about 50, and still more preferably about 25 to about 50 percent total solids, and preferably possess a viscosity of about 300 to about 600 cps. Such a combination gives a final product which is easy to apply and which demonstrates excellent adhesion to paper, cardboard, fiberboard, and the like.

The preferred energy absorbing compositions are preferably about 10 to about 80 percent total solids, more preferably about 20 to about 50, and still more preferably about 40 to about 50 total solids. The preferred viscosity is in the range of about 50 to about 600 cps.

The preferred coating compositions, when applied to a non-conductive surface at a rate which results in a coating thickness of about 0.5 to about 1.5 mils after drying or curing, demonstrate a resistance in the range of about 50 ohms to about 5000 ohms per square unit, and even more preferably demonstrate a resistance in the range of about 500 to about 2000 ohms per square unit, when a direct current is applied across a one inch distance and measured point to point.

The preferred energy absorbing compositions demonstrate a resistance in the range of about 10 to about 600 ohms per square unit.

By the term ohms/square or ohms per square, as used herein, is meant ohms per any practical square unit. That is, when a coating of a uniform thickness is examined, the resistance to a direct current from point A to point B, (t), is a function of the width of the square, (w), the distance between the points, (d), the thickness of the coatings, (t), and the nature of the conductive coating or material. The resistance varies directly with d and inversely with t and w. This can be expressed as R $=(K)(d)(t^{-1})(w^{-1})$. In all squares w=d; therefore, the above becomes R =k/t. (Again, this is because w=d regardless of whether the square is a square inch or a square foot.)

The anti-static coating compositions of the present invention are preferably applied to paper, cardboard, fiberboard, or other common container-type materials in a fluid or gelatinous form and allowed to cure or dry in situ. The compositions can be applied in any conventional manner such as screen printing, brushing, spraying, dipping, roller-coating, and the like.

The compositions are applied at a rate such that the coating thickness, after drying/curing, is in the range of about 0.1 to about 10.0 mils; preferably about 0.25 to about 4 mils; and more preferably about 0.5 to about 2.5 mils.

In a highly preferred embodiment, the compositions of the present invention are employed as an anti-static or static-bleed coating in the construction of a container-means. For example, a convention shipping or storage carton, such as a paper, cardboard, or fiberboard box, is continuously coated on all surfaces with an anti-static composition comprising a ground, calcined coal-based coke having an $E_c$ value of about 27 to about 80, and a resin polymer. More preferably, the coke has an $E_c$ value of about 28 to about 75, and still more preferably about 29 to about 65.

The container-means typically has a bottom, two opposing side walls, two opposing end walls, and a one- or two-piece cover secured to at least one wall by hinge means that move from a closed position sealing the container to a second open position which allows access to the interior of the container means. Such container means are frequently fashioned from paper, cardboard, or fiberboard, or other wood-based materials, but may also be made partially or wholly from polymer resins, metallic-based materials such as shelving, racks, and the like. The structures suitable for coating may also be subdivided within into a number of storage containers, i.e., honeycomb-like.

The container means may optionally include one or more conventional polymer foam-based cushion means, preferably urethane, secured to one or more interior walls of the container-means. The cushion means are preferably panels conforming substantially to the shape of wall and act to protect the contents of the containment means from physical shock encountered in shipping and handling. In a preferred embodiment, the cushion means is impregnated with a ground, calcined coal-based coke having an $E_c$ value of about 27 to about 80. The cushion means may also be coated with a composition of the present invention.

In another highly preferred embodiment, foam compositions of the present invention are employed in an energy absorbing capacity in an anechoic chamber.

It will also be appreciated that the compositions of the present invention are also useful in coating articles to provide protection from EMI or electromagnetic interference, i.e., to provide electromagnetic compatability (EMC).

A considerable amount of attention has been directed to the problem of EMI which is generated by a wide variety of relatively low power devices such as computers, calculators, video games, and the like. These individual devices create an amount of electromagnetic interference which can be quite troublesome when their components enter the frequency range of 1–1,000 megaHertz.

Such frequencies are reached in digital devices, such as computers, video games, and calculators, when the signal rate is drastically increased. When rapid signal pulses are employed in processing digital information, and in communicating this information, substantial harmonic frequencies are created; this is especially true when relatively square pulses are employed. Both radiated and/or conducted electromagnetic radiation can be generated by such devices. The sum of all of this radiation (pollution quotient) is substantially increased by the greatly expanding number of these devices now being clustered.

The basic approach to attenuation of EMI has been to encapsulate or enclose the devices or components thereof in an electrically conductive shell.

Metal housings were first employed but modern manufacturing processes have dictated a conversion to plastic housings and containments. Because plastic housings provide little or no shielding, substantial effort has been devoted to the development of a coating to be placed upon such plastic to shield interior circuits from radiation of EMI to the surrounding environment.

Thus, the compositions of the present invention may be employed to provide a coating on such housings to provide EMC (electromagnetic compatability) for the components within a device, or to a plurality of devices.

Further, the compositions of the present invention may be used to fashion part or all of the housing or containment means itself.

The compositions of the present invention are also useful as primers, as well as patching and repair compounds, for both metallic and non-conductive substrate such as plastic and glass articles of manufacture.

Because plastic articles do not possess any conductivity, when it is necessary or desirable to put an electropheretic or electrostatic coating or layer on a plastic article, such as a paint or metallic coating, it is necessary to add a conductive layer or primer.

Metallic conductive coatings are not appropriate for many reasons including cost, weight, and durability. To overcome these problems, the art has developed conductive polymeric coating by the addition of conductive particles and materials, such as zinc, copper, nickel, carbon black, and graphite, to the polymer.

With regard to employing the compositions of the present invention as primers, it will be appreciated that there are many advantages to a polymer-based conductive primer. The compositions of the present inventions, however, possess the advantages of exhibiting high conductivity and the ability to accept a durable decorative or protective overcoat. The primer materials are prepared and applied as described above.

Another added advantage to employing the compositions the present invention as primers is the low opacity demonstrated by such compositions at relatively medium to high coke:binder (pigment:binder) ratios. This results in a primer which possesses excellent "hold out" or gloss properties while at the same time retaining adequate conductivity and overcoat adhesion (overcoatability).

It has also been long appreciated that such conductive polymeric materials are useful as patching or repair compositions for metallic parts. The manufacture of metal articles frequently results in surface flaws and defects. Repair of these defects with metallic materials is difficult and expensive. While repair with polymeric materials is much easier and more economical, when the object is to undergo electropheretic or electrostatic coating processes, the portion of the article repaired with the polymeric material will not accept the deposit because it is non-conductive. Thus, conductive polymeric material must be employed. And, again, it is in such applications that the compositions of the present invention are particularly suited. The compositions of the present invention are highly conductive and can accept a durable decorative or protective overcoat or deposit.

It will be appreciated that when selecting a polymeric binder or matrix which is to be used in a repair or patching mode, it must be selected so that it will adhere or bond tightly with the material used in the original manufacture. This adhesion can be demonstrated and must be maintained under typical environmental testing procedures, e.g., salt spray, humidity, and weatherometer tests.

The improved viscosity of the compounds of the present invention, especially when the composition has a high solids content, also allows the compositions of the present invention to be adapted to be moldable; thus, the entire article, or portion thereof, is conductive without the addition of an overcoat.

When preparing a molding, patching or repair composition, it may be desirable, for example, to employ (in addition to the cokes described herein), one or more polymeric resin binder systems such as a polyester resin at a level of about 5 to about 15 percent by weight of the molding composition. More preferably, the resin is employed at a level of about 7 to about 10 percent, by weight.

Conventional additives may be employed in such moldable compositions, including those discussed above, at their art-disclosed level. Particularly useful additives include flame retardancy materials such as antimony trioxide at a level of about 0.10 to about 2.0 percent, by weight, or aluminum trihydrate ($Al_2O_3 \cdot 3H_2O$) at a level of about 10 to about 50 percent, by weight; brominated unsaturated polyester resin having about 20 to about 50 percent bromine groups, by weight of the polyester may also be employed.

A free radical polymerization catalyst may also be employed at a level of at least about 0.1 percent by weight of the unsaturated resin.

The cokes of the present invention possess an advantage over the use of graphite in such composition because of graphites interference with such free radical catalysts. For example, while a wide range of such catalysts are useful, the preferred catalysts may be selected from lauroyl peroxide, benzoyl peroxide, ketone peroxides such as methylethylketone peroxide, cyclohexanone peroxide, methyl isobutyl ketone peroxide, and others. Less commonly used but also known peroxides include dicumyl peroxide, 2,2-bis 4,4-ditertiarybutyl peroxide, cyclohexyl peroxide, ditertiary butyl peroxide, cumene hydroperoxide, tertiary butyl cumyl peroxide, tertiary butyl perocoate and tertiary butyl perbenzoate.

Internal mold release agents, such as zinc stearate, calcium stearate, magnesium stearate, organic phosphate esters and other organic liquid internal mold release agents would generally be employed in the resinous system of this invention. Such internal release agents are normally employed in minor amounts on the order of approximately 0.5 to about 4.5 weight percent of the molding composition and help insure that the molded part will not adhere to the heated metal die surfaces. Use of such compounds is well within the skill of the art.

Other additions to the molding compositions of this invention are useful for modifying the properties. One example is the use of fiber reinforcement in amounts of about 10 to 30 percent. Such reinforcing fibers add significant strength and provide an acceptable filling agent. A wide variety of reinforcing fibers are available for use in forming the compounds of this invention, some examples being glass fibers, carbon fibers, sisal fibers, "Kevlar" fibers, asbestos fibers, cotton fibers, and metal fibers such as steel fibers and whiskers, boron fibers and whiskers, and graphite fibers and whiskers. In addition, a wide variety of organic reinforcing fibers could be used. Glass fibers are the preferred fibers for most applications because of their high strength benefit and a relatively low cost.

The use of a viscosity modifying agent is also contemplated with the molding composition of this invention. One example of suitable viscosity modifying agents are the metallic oxide or hydroxides selected from the group consisting of calcium and magnesium oxides and hydroxides. The choice of the metallic oxide or hydroxide is a matter of individual preference, and depends upon the particular combination of polyester resins used and the exact manufacturing process to be employed for producing the finished articles. The choice of the proper oxide or hydroxide is within the skill of the art. Further information on the use of metallic oxides or hydroxides can be found in U.S. Pat. Nos. 4,067,845 and 4,336,181, the disclosures of both being expressly incorporated herein by reference.

Additional additives to this invention include acrylic syrups used as a carrier for viscosity modifying agents and pigments which can be added in minor amounts to achieve the desired color in an as-molded product.

In greater detail, some minor amounts of nonreinforcing fillers or fibers may be added to the uncured composition to reduce overall weight, modify the properties or reduce material costs. Some types of fillers which are countenanced within the scope of this invention include inorganic fillers, i.e., silicates, asbestos, calcium carbonate, mica, barytes, clay, diatomaceous earth, microballoons, microspheres, silica and fuller's earth. For example, these fillers may be added in amounts from about 0 to 15 parts by weight per 100 parts of the total molding composition.

In order to further illustrate the benefits and advantages of the present invention, the following examples are provided. It will be understood that the examples are provided for illustrative purposes and are not intended to be limiting of the scope of the invention as herein disclosed and as set forth in the claims. All materials are added and admixed in a conventional manner unless otherwise indicated.

See also commonly assigned U.S. patent application Ser. No. 757,084, "Conductive Cathodic Protection Compositions and Methods", Robert E. Wiley; and U.S. patent application Ser. No. 757,085, "Conductive Coatings for Elongated Conductors", Robert E. Wiley, both filed herewith; both expressly incorporated herein by reference.

EXAMPLE I
PLASTIC CONTAINER AND PAPER-CARDBOARD FIBERBOARD STATIC BLEED COATINGS EXHIBITING NONBURNISHING

Formulation No. 1

| Ingredient | Source | Identity |
|---|---|---|
| 9.51 Coke* | | |
| 1.90 Carbon Black | | |
| 0.38 Cellosize ZP4OH | Union Carbide | Hydroxethyl Cellulose |
| 0.13 Sindar G-4 | Givardon | 2,2 Methylene BIS (4-Chlorophenol) |
| 0.09 Octyl Alcohol | Matheson | 1-Octanol |
| 0.34 Tamol SN | Rohm and Haas | Neutral Sodium Salt of Condensed Aryl Sulfonic Acid |
| 28.55 Deionized Water | ACUS | Deionized Water |

The above are charged into a Pebble mill and run for about 40 hours.
Next, the following are added at slow speed.

| Ingredient | Source | Identity |
|---|---|---|
| 27.27 AMSCO-RES 6510 | Union 76 | Acrylic Emulsion |
| 13.64 AMSCO-RES 3077 | Union 76 | Vinyl Acetate/Acrylic Emulsion |
| 14.55 5% Ammonia (28%) in Deionized Water | ACUS | |
| 3.64 Deionized Water | ACUS | Deionized Water |
| 100.00 | | |

Typical Properties

| | |
|---|---|
| Weight/Gallon | 8.98 |
| Percent Solids | 36–38% |
| Brookfield Viscosity | 300–600 cps |
| Resistance - Air Dry or Bake | 2K ohms - 4K ohms 1" point to point at 0.7–1 mil dry film thickness |
| Air Dry Time to Handle: | 1. Over Plastic 10–20 minutes<br>2. Over Cardboard 5–10 minutes |

The resulting coating demonstrates good adhesion at 0.5–1 Mil on the following materials:
- Polystyrene,
- Fiberboard,
- Lexan,
- Cardboard, and
- Foamed Plastic (Polystyrene).

The following acrylic resins may be substituted, in whole or in part, for the acrylic resin above and substantially similar results are obtained.

| Resin | Source | Identity |
|---|---|---|
| Rhoplex AC-64 | Rohm and Haas | Acrylic Emulsion |
| Rhoplex AC-34 | Rohm and Haas | Acrylic Emulsion |
| Rhoplex MC-76 | Rohm and Haas | Acrylic Emulsion |
| Rhoplex HA-8 | Rohm and Haas | Acrylic Emulsion |
| Rhoplex 1895 | Rohm and Haas | Acrylic Emulsion |
| Rhoplex 1829 | Rohm and Haas | Acrylic Emulsion |
| Neo Cryl A1044 | Polyvinyl Chemical | Acrylic Emulsion |

Formulation No. 2

| Ingredient | Source | Identity |
|---|---|---|
| 12.44 Coke* | | |
| 1.82 Carbon Black | | |
| 0.42 Cellosize ZP4OH | Union Carbide | Hydroxyethyl Cellulose |
| 0.14 Sindar G-4 | Givardon | 2,2 Methylene BIS BIS (4-Chlorophenol) |
| 0.09 Octyl Alcohol | Matheson | 1-Octanol |
| 0.23 Tamol SN | Rohm and Haas | Neutral Sodium Salt of Condensed Aryl Sulfonic Acid |
| 27.30 Deionized Water | ACUS | Deionized Water |

The above ingredients are Pebble milled for about 24 hours to an 8 Hegmann grind. Next, the following are added at slow speed.

| Ingredient | Source | Identity |
|---|---|---|
| 21.23 Neo Cryl A1044 (47% Solids) | Polyvinyl Chemical | Acrylic Copolymer |
| 14.15 AMSCO RES 3077 (55% Solids) | Union 76 | Vinyl Acetate/Acrylic Copolymer |
| 19.34 5% Ammonium Hydroxide (28%) in Deionized | Local and ACUS | |

|  | -continued | |
|---|---|---|
| | Water | |
| 2.84 | Deionized Water | Local and ACUS |

Typical Properties
| | |
|---|---|
| Weight/Gallon | 9.20 |
| Percent Solids | 31.33% |
| pH | 9.9–10.0 |
| Percent Volume Solids - 24% | Coverage 384 sq. ft. at 1 mil |
| Viscosity | 250–350 cps Brookfield |
| Resistance Air Dry or Bake | 1.2–2.7K Ohms/point to point 1 inch at 0.7 to 1 mil DFT |
| Air Dry Time to Handle: | 1. Over Plastic 10–20 minutes |
| | 2. Over Cardboard 5–10 minutes |

The resulting coating demonstrates good adhesion at 0.5–1 Mil on the following materials:
- Polystyrene,
- Fiberboard,
- Lexan,
- Cardboard, and
- Foamed Plastic (Polystyrene).

These products exhibit good adhesion to a variety of substrates and are nonburnishing. The resistance values can be adjusted upwards or downward by changing the levels of the binder and/or adding inert pigments such as calcium carbonate, magnesium silicate, etc. Substantially similar results are obtained when the carbon black of the above formulations is replaced, in whole or in part, with coke*.
*indicates that this material has an $E_c$ of about 29.

EXAMPLE II
CONDUCTIVE FOAMS

Aqueous Base 1

| | | Source | Identity |
|---|---|---|---|
| 29.34 | Coke* | | |
| 4.32 | Carbon Black | | |
| 0.99 | Cellosize QP4OH | Union Carbide | Hydroxyethyl Cellulose |
| 0.33 | Sindar G-4 | Givardon | 2,2 Methylene BIS (4-Chlorophenol) |
| 0.22 | Octyl Alcohol | Matheson | 1-Octanol |
| 0.54 | Tamol SN | Rohm and Haas | Neutral Sodium Salt of Condensed Aryl Sulfonic Acid |
| 64.26 | Deionized Water | ACUS | Deionized Water |
| 100.00 | | | |

Grind about 24 hours in a pebble mill.
| | |
|---|---|
| Solids | 35.5 |
| Hegman | 8+ |
| pH | 8+ |
| Viscosity | 600–700 cps (Brookfield) |

Aqueous Base 2

| | | Source | Identity |
|---|---|---|---|
| 23.25 | Coke* | | |
| 4.65 | Carbon Black | | |
| 0.93 | Cellosize QP40H | Union Carbide | Hydroxyethyl Cellulose |
| 0.32 | Sindar G-4 | Givardon | 2,2 Methylene BIS (4-Chlorophenol) |
| 0.22 | Octyl Alcohol | Matheson | 1-Octanol |
| 0.84 | Tamol SN | Rohm and Haas | Neutral Sodium Salt of Condensed Aryl Sulfonic Acid |
| 69.79 | Deionized Water | ACUS | Deionized Water |
| 100.00 | | | |

Pebble mill for 40 hours to 8 Hegmann.
| | |
|---|---|
| Solids | 30–32% |
| Weight/Gallon | 9.83 |
| pH | 8+ |
| Viscosity | 100–200 cps (Brookfield) |
| Hegmann | 8 |

A conductive foam is then prepared by the addition of an aqueous base selected from the above to a Hypol foam such as FHP-3000, FHP-2000, or FHP-2002 at a vol:vol ratio of about base:foam of about 3:1 to about 1:3; about 20 to about 30 percent use of additional deionized water is also added.
Substantially similar results are obtained when the carbon black is replaced, in whole or in part, with coke*.
*indicates that this material has an $E_c$ of abuut 29.

EXAMPLE III
CONDUCTIVE PRIMERS

-continued

Formulation No. 1

| | | | |
|---|---|---|---|
| 23.80 | Acryloid B98 (50% NVM) | Rohm and Haas | Acrylic |
| 11.90 | Coke* | | |
| 2.38 | Carbon Black | | |
| 42.85 | Toluol | | |
| 19.07 | Xylol | | |
| 100.00 | | | |

Shot mill 30 minutes.
% Solids            26.18
Resistance         400 ohms 1" Point to Point
Pigment/Binder    1.19/1

Formulation No. 2

| | | | |
|---|---|---|---|
| 22.85 | B48S (45% NVM) | Rohm and Haas | Acrylic |
| 5.71 | B99 (50% NVM) | Rohm and Haas | Acrylic |
| 14.29 | Coke* | | |
| 57.15 | Toluol | | |
| 100.00 | | | |

Shot mill above for 20 minutes.
Resistance         1KΩ Point to Point 1"
% Solids            27.43
Pigment/Binder    1.09/1

Formulation No. 3

| | | | |
|---|---|---|---|
| 23.80 | Acryloid B99 (50% NVM) | Rohm and Haas | Acrylic |
| 11.90 | Coke* | | |
| 2.39 | Carbon Black | | |
| 42.85 | Toluol | | |
| 19.06 | Xylol | | |
| 100.00 | | | |

Resistance         0.3KΩ 1" Point to Point - Air Dry
% Solids            26.19
Pigment/Binder    1.20/1

Formulation No. 4

| | | | |
|---|---|---|---|
| 6.14 | Acryloid B99 (50% NVM) | Rohm and Haas | Acrylic |
| 20.46 | Acryloid B48S (45% NVM) | Rohm and Haas | Acrylic |
| 20.46 | Toluol | | |
| 29.24 | Xylol | | |
| 6.14 | Coke* | | |
| 8.18 | Ferrophos 2132 | Hooker Chem. | Ferrophos |
| 0.60 | MPA-60 (Xylol) | Baker | Suspension Aid |
| 100.00 | | | |

Shot mill for 30 minutes.
Reduce to spray 3(Paint):1(Toluol/xylol) (by volume).
Resistance         1" Point to Point 160KΩ
Pigment/Binder    1.16/1
% Solids            27%
The above demonstrates good adhesion to Glass, Metal, and Plastic.

Formulation No. 5

| | | | |
|---|---|---|---|
| 38.46 | Acryloid B99 (50% NVM) | Rohm and Haas | Acrylic |
| 19.23 | Coke* | | |
| 3.89 | Carbon Black | | |
| 38.42 | Toluol | | |
| 100.00 | | | |

Shot mill 30 minutes.
Resistance         0.3KΩ 1" Point to Point
Coating is smooth, adherent to 135 Lexan.
% Solids            42.35
Pigment/Binder    1.21/1

Formulation No. 6

| | | | |
|---|---|---|---|
| 11.43 | B48S | Rohm and Haas | Acrylic |
| 2.85 | B99 | Rohm and Haas | Acrylic |
| 20.80 | Coke* | | |
| 64.92 | Toluol | | |
| 100.00 | | | |

Resistance         500KΩ 1" Point to Point
% Solids            27.3
Pigment/Binder    3.2/1

Formulation No. 6

| | | | |
|---|---|---|---|
| 18.28 | B48S | Rohm and Haas | Acrylic |
| 4.56 | B99 | Rohm and Haas | Acrylic |
| 16.91 | Coke* | | |
| 60.25 | Toluol | | |
| 100.00 | | | |

Resistance         825KΩ 1" Point to Point
% Solids            27.4
Pigment/Binder    1.6/1

*indicates that this material has an $E_c$ of about 29.

What is claimed is:

1. A conductive coating composition useful in protecting electronic components and the like from damage caused by stray electrostatic discharge when applied to a surface which may come into close proximity with said components comprising:
   (a) about 5 percent to about 50 percent total elemental carbon by weight of the composition;
   (b) about 2 percent to about 50 percent of a polymeric binder by weight of the composition;
   (c) about 5 percent to about 93 percent of a solvent by weight of the composition; and
   (d) about 0 percent to about 5 percent of a surfactant by weight of the composition;
   wherein about 5 percent to about 95 percent of said total elemental carbon, by weight of the elemental carbon, is a ground coal-based, calcined coke, said coke demonstrating an $E_c$ value of about 27 to about 80.

2. A composition according to claim 1 wherein the final composition is essentially graphite free.

3. A composition according to claim 1 wherein the elemental carbon is present at a level of about 5 percent to about 25 percent, by weight of the composition.

4. A composition according to claim 1 wherein about 50 percent to about 95 percent of the total elemental carbon, by weight, is the coal-based, calcined coke.

5. A composition according to claim 4 wherein about 70 percent to about 95 percent of the elemental carbon, by weight, is the coal-based, calcined coke.

6. A composition according to claim 1 wherein the surfactant is present at a level of about 1 percent to about 2 percent, by weight of the composition.

7. A composition according to claim 1 wherein the polymeric binder is selected from the group consisting of acrylic, acrylic emulsions, acrylic latex, polyvinyl acetates, polyvinyl chlorides, epoxys, and mixtures thereof.

8. A composition according to claim 7 wherein the polymeric binder is selected from the group consisting of methyl acrylate, ethyl acrylate, methyl methacrylate, ethyl methacrylate, allyl methacrylate, n-butyl methacrylate, isobutyl methacrylate, an epoxy, polyvinyl chloride, polyvinyl acetate, polyvinylidine chloride, and mixtures thereof.

9. A composition according to claim 8 wherein the polymer binder includes a binary mixture of an acrylic and a polyvinyl polymer.

10. A composition according to claim 8 wherein the solvent includes water.

11. A composition according to claim 10 wherein the water is present at a level of about 20 percent to about 75 percent, by weight of the composition.

12. A composition according to claim 1 which additionally comprises:
   (a) about 0.1 percent to about 5 percent of a thickener;
   (b) about 0.01 percent to about 2.5 percent of a $C_3$–$C_{12}$ fatty alcohol; and
   (c) about 0.01 percent to about 2.5 percent of a compound selected from the group consisting of antimicrobials, antifungals, and mixtures thereof.

13. A composition according to claim 1 wherein the value for the coke is about 28 to about 75.

14. A composition according to claim 13 wherein the value for the coke is about 18 to about 65.

15. A polymer-based composition useful in absorbing mechanical and electromagnetic energy comprising:
   (a) about 5 percent to about 50 percent total elemental carbon by weight of the composition;
   (b) about 2 percent to about 50 percent of a polymeric binder by weight of the composition;
   (c) about 30 percent to about 93 percent of a solvent by weight of the composition; and
   (d) about 0 percent to about 5 percent of a surfactant by weight of the composition;
   wherein about 5 percent to about 95 percent of said total elemental carbon, by weight of the elemental carbon, is a ground coal-based calcined coke, said coke demonstrating an $E_c$ value of about 27 to about 80.

16. A composition according to claim 15 wherein the elemental carbon is present at a level of about 5 percent to about 25 percent, by weight of the composition.

17. A composition according to claim 15 wherein about 50 percent to about 95 percent of the total elemental carbon, by weight, is the coal-based, calcined coke.

18. A composition according to claim 17 wherein about 70 percent to about 95 percent of the elemental carbon, by weight, is the coal-based, calcined coke.

19. A composition according to claim 15 wherein the surfactant is present at a level of about 1 percent to about 2 percent, by weight of the composition.

20. A composition according to claim 15 wherein the polymeric binder is a foam resin.

21. A composition according to claim 20 wherein the polymeric binder is selected from the group consisting of urethane foams, vinyl foams, silicone foams, and mixtures thereof.

22. A composition according to claim 21 wherein the polymer binder is a urethane foam.

23. A composition according to claim 21 wherein the solvent includes water.

24. A composition according to claim 23 wherein the water is present at a level of about 30 percent to about 93 percent, by weight of the composition.

25. A composition according to claim 15 which additionally comprises about 0.1 percent to about 5 percent of a thickener.

26. A composition according to claim 15 which additionally comprises about 0.01 percent to about 2.5 percent of a $C_3$–$C_{12}$ fatty alcohol.

27. A composition according to claim 15 which additionally comprises about 0.01 percent to about 2.5 percent of a compound selected from the group consisting of antimicrobials, antifungals, and mixtures thereof.

28. A composition according to claim 15 wherein the value for the coke is about 28 to about 75.

29. A composition according to claim 28 wherein the value for the coke is about 28 to about 65.

30. A conductive coating composition comprising:
   (a) about 5 percent to about 50 percent total elemental carbon by weight of the composition;
   (b) about 2 percent to about 50 percent of a polymeric binder by weight of the composition;
   (c) about 5 percent to about 93 percent of a solvent by weight of the composition; and (d) about 0 percent to about 5 percent of a surfactant by weight of the composition;

wherein substantially all of the elemental carbon is a ground coal-based, calcined coke, said coke demonstrating an $E_c$ value of about 27 to about 80.

31. A polymer-based composition useful in absorbing mechanical and electromagnetic energy comprising:
 (a) about 5 percent to about 50 percent total elemental carbon by weight of the composition;
 (b) about 2 percent to about 50 percent of a polymeric binder by weight of the composition;
 (c) about 30 percent to about 93 percent of a solvent by weight of the composition; and
 (d) about 0 percent to about 5 percent of a surfactant by weight of the composition;

wherein about 5 percent to about 95 percent of said total elemental carbon, by weight of the elemental carbon, is a ground coal-based, calcined coke, said coke demonstrating an $E_c$ value of about 27 to about 80.

32. A composition according to claim 1 wherein the $E_c$ value is measured for the 002 peak when subjected to x-ray powder diffraction employing Mo K$\alpha$ radiation with an average wavelength of 0.71Å.

33. A composition according to claim 15 wherein the $E_c$ value is measured for the 002 peak when subjected to x-ray powder diffraction employing Mo K$\alpha$ radiation with an average wavelength of 0.71Å.

34. A composition according to claim 1 wherein the $E_c$ value is measured for the 002 peak when subjected to x-ray powder diffraction employing Mo K$\alpha$ radiation with an average wavelength of 0.71Å.

35. A composition according to claim 31 wherein the Ec value is measured for the 002 peak when subjected to x-ray powder diffraction employing Mo K$\alpha$ radiation with an average wavelength of 0.71Å.

* * * * *

UNITED STATES PATENT AND TRADEMARK OFFICE
CERTIFICATE OF CORRECTION

PATENT NO. : 4,818,437

DATED : April 4, 1989

INVENTOR(S) : Robert E. Wiley

It is certified that error appears in the above-identified patent and that said Letters Patent is hereby corrected as shown below:

"U.S. Patent Documents" on title page,
"Notice of References Cited", dated 9/86,
"Van", No. 4,188,279, should be --Yan--.

Column 2, line 21,
"maganese" should be --manganese--.

Column 4, line 61,
"non-graphite" should be --non-graphitic--.

Column 5, line 41,
"pryolysis" should be --pyrolysis--.

Column 7, line 10,
"usch" should be --such--.

Column 7, line 21,
after "will" (first occurrence), insert --be--.

Column 7, line 60,
"metacrylate" should be --methacrylate--.

UNITED STATES PATENT AND TRADEMARK OFFICE
CERTIFICATE OF CORRECTION

PATENT NO. : 4,818,437

DATED : April 4, 1989

INVENTOR(S) : Robert E. Wiley

It is certified that error appears in the above-identified patent and that said Letters Patent is hereby corrected as shown below:

Column 8, lines 65 and 66,
"magentic" should be --magnetic--.

Column 9, line 25,
"10" should be --15--.

Column 9, line 33,
"20" should be --2--.

Column 12, lines 56 and 57,
after "compositions" insert --of--.

Column 15, line 12,
"Hydroxethyl" should be --Hydroxyethyl--.

Column 15, line 69,
after "Methylene" delete --BIS--.

Column 17, line 34,
insert "Ingredient" as column heading for first column.

UNITED STATES PATENT AND TRADEMARK OFFICE
CERTIFICATE OF CORRECTION

PATENT NO. : 4,818,437
DATED : April 4, 1989
INVENTOR(S) : Robert E. Wiley

It is certified that error appears in the above-identified patent and that said Letters Patent is hereby corrected as shown below:

Column 17, line 49,
before "Solids" insert --%--.

Column 17, line 55,
insert "Ingredient" as column heading for first column.

Column 17, line 70,
before "Solids" insert --%--.

Column 17, line 82,
"abuut" should be --about--.

Column 19, line 38,
"20.46 Toluol" should be --29.24 Toluol--.

Column 19, line 60,
"135 Lexan" should be --Lexan--.

Column 19, line 72,
"Formulation No. 6" should be --Formulation No. 7--.

Column 24, line 16, Claim 35,
"Ec" should be --$E_c$--.

Signed and Sealed this

Twenty-sixth Day of December, 1989

Attest:

JEFFREY M. SAMUELS

Attesting Officer     Acting Commissioner of Patents and Trademarks